United States Patent [19]

Kerschner et al.

[11] Patent Number: 4,818,933
[45] Date of Patent: Apr. 4, 1989

[54] BOARD FIXTURING SYSTEM

[75] Inventors: Ronald K. Kerschner; James M. Hayes; Michael L. Bullock, all of Loveland, Colo.

[73] Assignee: Hewlett-Packard Company, Palo Alto, Calif.

[21] Appl. No.: 916,667

[22] Filed: Oct. 8, 1986

[51] Int. Cl.[4] ..................... G01R 31/22; G01R 31/00
[52] U.S. Cl. .............................. 324/158 F; 324/158 P; 324/73 PC; 324/73 AT
[58] Field of Search ........... 324/158 F, 158 P, 73 PC; 198/738, 728, 718; 209/508, 564; 292/19, 302, 303; 414/225, 217; 403/326, 329; 411/539

[56] References Cited

U.S. PATENT DOCUMENTS

| | | | |
|---|---|---|---|
| 2,358,837 | 9/1944 | Tinnerman | 411/529 |
| 2,587,355 | 2/1952 | McEwan | 292/302 |
| 2,775,156 | 12/1956 | Imse et al. | 411/529 |
| 3,017,570 | 1/1962 | Floyd | 324/73 At |
| 3,197,022 | 7/1965 | Scheidenhelm | 198/728 |
| 3,387,529 | 6/1968 | Flora | 411/529 |
| 3,629,702 | 12/1971 | Henken | 324/158 F |
| 3,970,934 | 7/1976 | Aksu | 324/158 F |
| 4,103,232 | 7/1978 | Sugita et al. | 324/158 F |
| 4,311,427 | 1/1982 | Coad et al. | 414/225 |
| 4,320,339 | 3/1982 | Vancelette | 324/158 F |
| 4,351,108 | 9/1982 | Johnson | 324/158 F |
| 4,432,458 | 2/1984 | Daboub | 209/564 |

Primary Examiner—Reinhard J. Eisenzopf
Assistant Examiner—Vinh P. Nguyen
Attorney, Agent, or Firm—William W. Cochran

[57] ABSTRACT

A board fixturing system is described for interfacing a printed circuit board having electronic devices at predetermined locations thereon to a probe plate having electrical contacts at predetermined locations. The fixturing system is mechanical and avoids the problems and limitations of the conventional vacuum fixturing systems. The fixturing system includes a unique conveyor system which is capable of staging one board while testing another, i.e. one board can be tested while another board is advanced toward the test fixture. A cassette system for the probe plates is also provided.

26 Claims, 22 Drawing Sheets

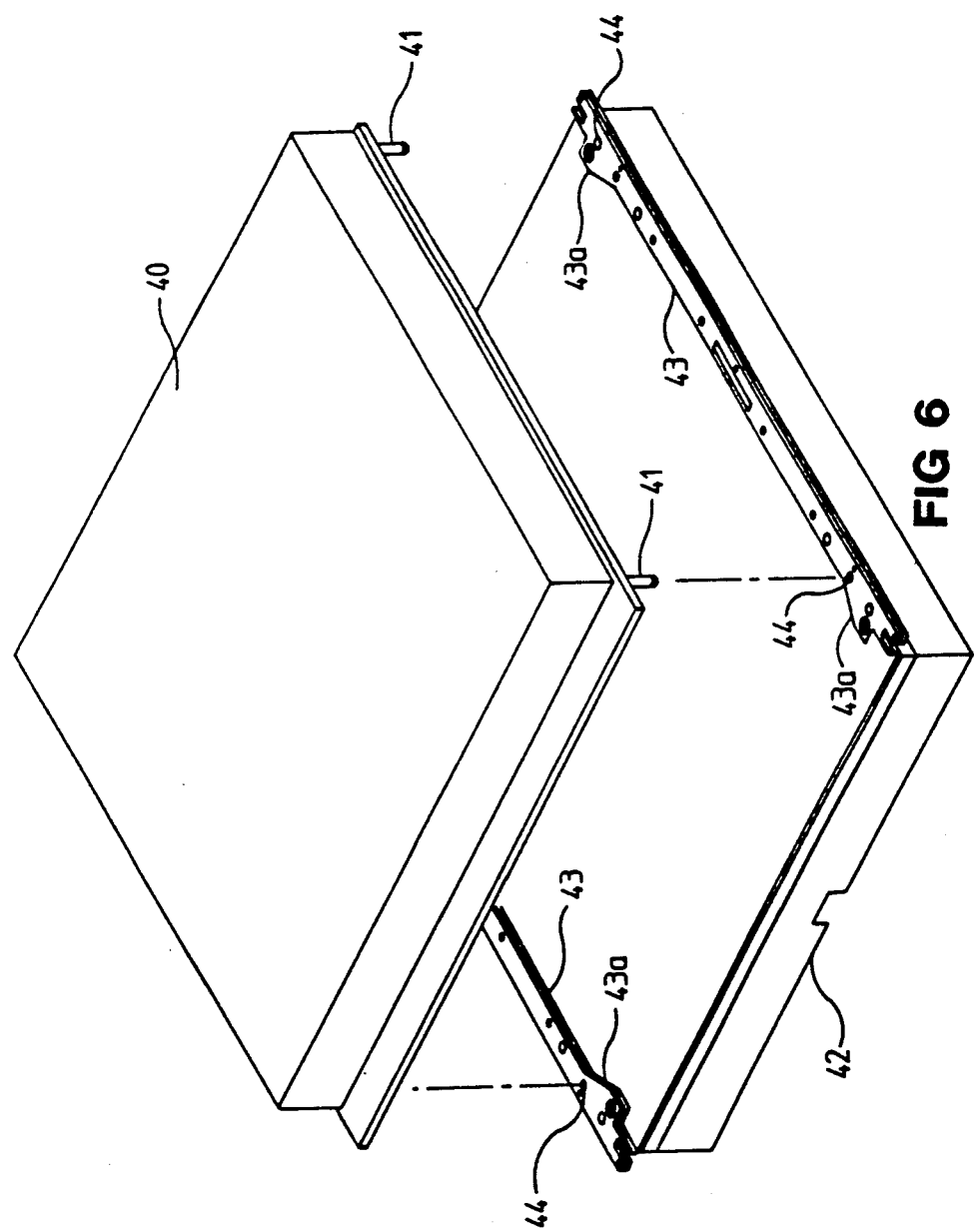

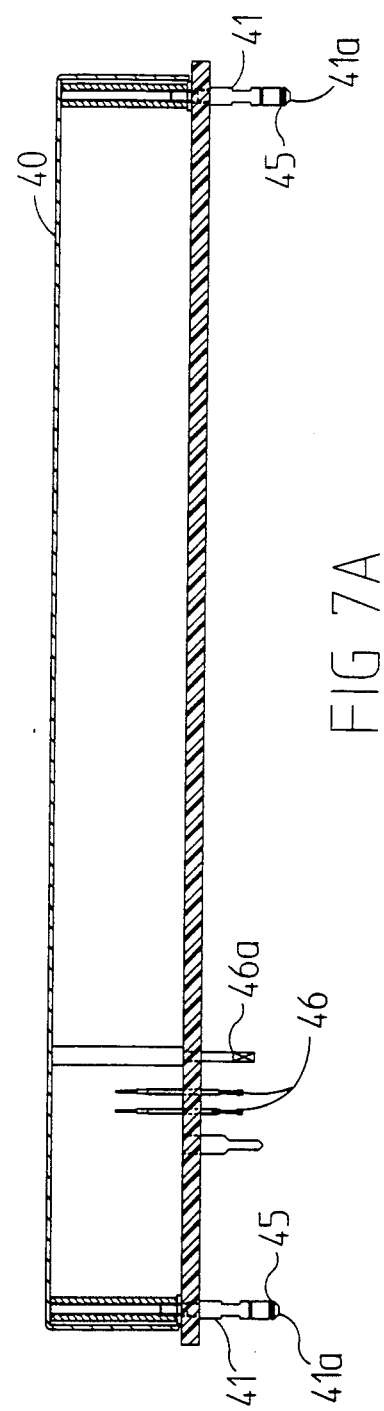

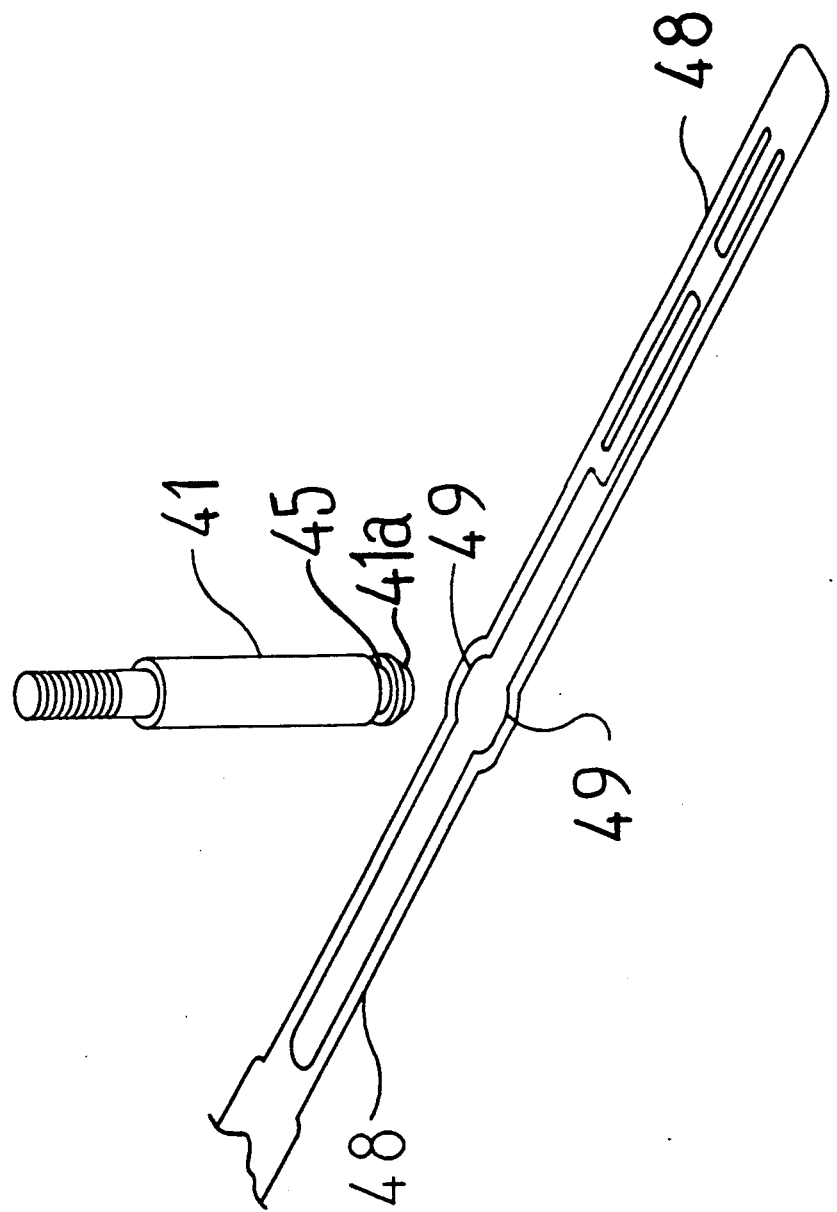

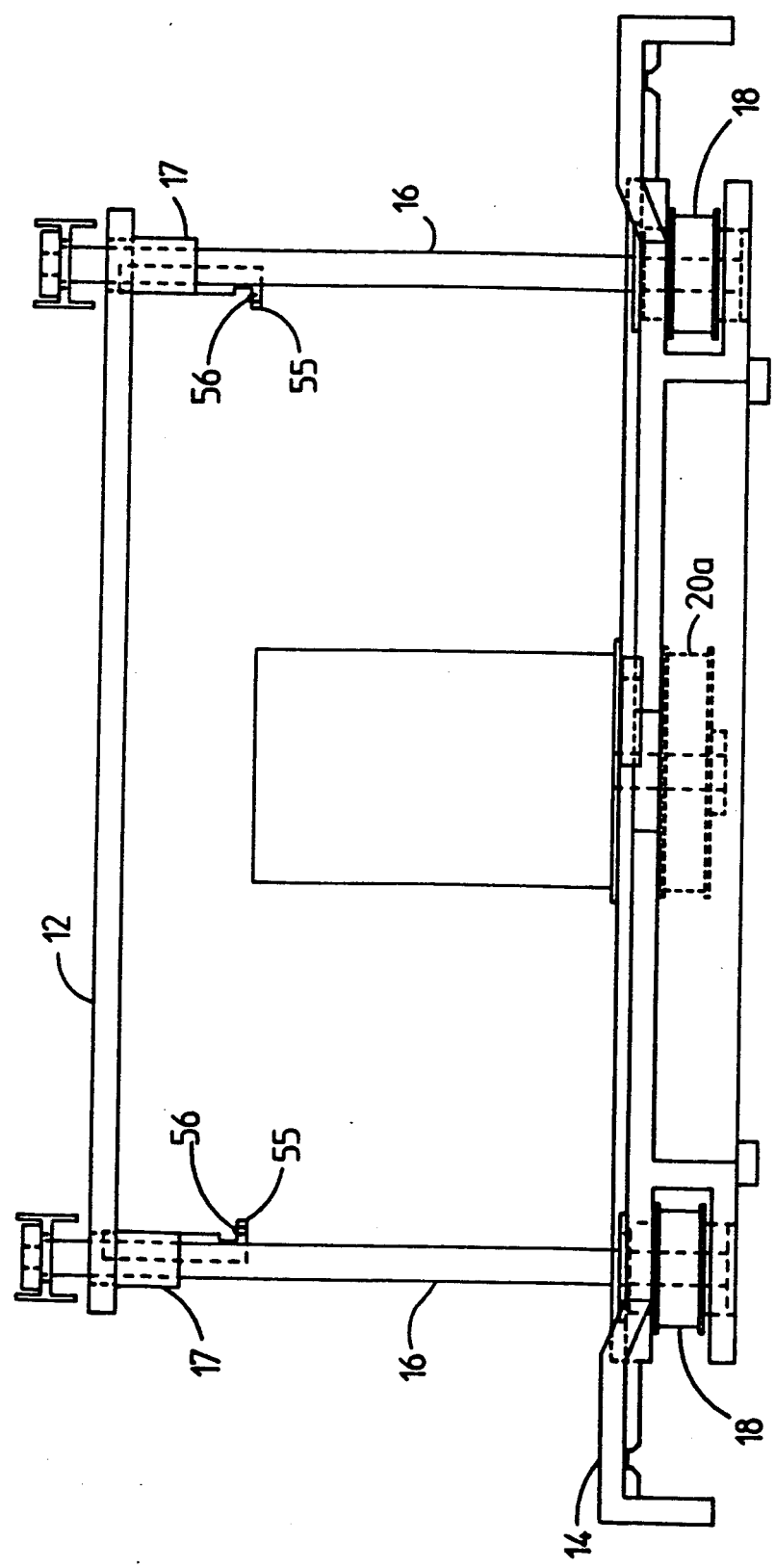

BOARD FIXTURING SYSTEM

FIELD OF THE INVENTION

This invention relates to techniques for handling circuit boards during incircuit and functional testing. More particularly, this invention relates to techniques, apparatus, and systems for automated circuit board handling and testing.

BACKGROUND OF THE INVENTION

After printed circuit boards have been manufactured, and before they can be used or placed into assembled products, they must be tested to verify that all required electrical connections have been properly completed and that all necessary electrical components have been attached or mounted to the board in proper position and with proper orientation.

Other reasons for testing are to determine and verify whether the proper components have been used and whether they are of the proper value. It is also necessary to determine whether each component performs properly (i.e., in accordance with the specification). Some electrical components also may require adjustment after installation.

It is possible for humans to manually handle the printed circuit boards for testing, i.e, selecting and delivering the boards to a test fixture, loading the boards into the tester, interacting with the tester by making any required adjustments, removing the boards from the tester, attaching any required repair ticket to the board, and sorting the boards into pass or fail outputs.

There are, of course, several disadvantages and limitations associated with manual handling and probing of the printed circuit boards. For example, the manual probing is a tedious task, and the speed with which a human can perform these tasks is necessarily limited by human abilities. Also, humans sometimes create errors which can be costly, for example, by rejecting a board which is acceptable or by accepting or approving a board which is defective. There are also dangers involved for humans, such as electrical and mechanical hazards. Humans can also create errors by inserting a board into a test fixture with improper orientation (e.g., rotation or translation). There is also danger of static electricity affecting components if the operator is not properly grounded.

As a result of the foregoing problems and limitations, there have been developed fixturing systems for the purpose of handling printed circuit boards for testing. The most common of such fixturing systems is a vacuum fixture. Manufacturers of such type of fixtures include Pylon, Contact Products, Virginia Panel Corp., Teradyne, Gen Rad, Testron, OB Test Group, and others.

There are many disadvantages associated with vacuum fixturing. In vacuum fixturing, atmospheric pressure acts directly on a board with a vacuum beneath it, forcing the board against spring loaded testing probes. Problems arise from the need to maintain a seal around the board. Maintaining a vacuum seal in an automated environment is even more troublesome. Wraped printed circuit boards are commonly encountered and require a separate effort or effect to push and seat them in the fixture gasketing material. Boards with holes or apertures generally complicate vacuum fixturing techniques. Also, node density is limited by atmospheric pressure. The seals and gasketing required also involve much maintenance, and contaminants and other foreign matter may be sucked into the fixture due to the vacuum. There is still some manual handling required with vacuum fixturing, thereby creating opportunities for human error (e.g., improper board insertion, potential for static electricity damage to components if operator is not grounded). Furthermore, it is difficult to do dual sided probing or multi-stage probing (i.e., probing a board with probes of different engagement heights in more than one step) of boards in such fixtures.

Although a mechanical fixturing system has been proposed by Matsushita and others, such systems do have a number of limitations and disadvantages. For example, there are long wire lengths from the tester to the fixture. Also, the conveyor only moves the board to a fixed position at the edge or side of the fixture. Sometimes a special hole, in a defined location, must be provided in the board to accommodate a pin driven by an air cylinder to move the board to a fixed testing position. Further, such systems do not include the capability of being able to move the upper probe plate to a specific vertical position relative to the lower probe plate. Also, such systems are not easily adjusted for different board widths.

SUMMARY OF THE PRESENT INVENTION

In accordance with the present invention there is provided a board fixturing system for interfacing a printed circuit board having electronic devices at predetermined locations thereon to one or more probe plates having electrical contacts at predetermined locations corresponding to the locations of the electronic devices on the printed circuit board. In one embodiment, the board fixturing system comprises:

(a) a frame member;

(b) at least one probe plate supported within the frame member;

(c) probing means carried by the probe plate, the probing means being adapted to send and receive electronic signals to and from predetermined locations on the printed circuit board when the board is in electrical contact with the probing means;

(d) bias means adapted to bias the board into contact with the probing means;

(e) alignment means adapted to align the board with the probing means;

(f) conveyor means adapted to engage and transport the board from a location outside the frame member to the position adjacent the probe plate; the conveyor means being further adapted to transport the board from a position adjacent the probe plate to another position outside the frame member; and (g) disengagement means adapted to disengage the board from the conveyor means when the board is adjacent the probe plate.

The present invention also provides apparatus which is useful in the board fixturing system. The apparatus and the system of this invention are useful for automated testing of printed circuit boards with leaded and surface mount components. The system and apparatus are capable of dual sided probing and also dual stage probing for combinational testing of a printed circuit board.

The present invention also provides a unique conveyor system for conveying a printed circuit board to the test fixture.

The advantages of the board fixturing system of the present invention are numerous. This system enables high through put due to automated handling of printed circuit boards. The board being tested, and its position along the conveyor, can be controlled by software programming. The upper probe plate position can also be controlled by programming. The system includes the capability of being able to move one or both of the probe plates to a specific position relative to each other. The system easily allows for dual sided probing and also multiple stage probing of a board, thereby enabling both functional and incircuit testing. The conveyor system is adaptable to different size boards. The probe plates may be adapted to be latched together to form a cassette. It is also possible to handle printed circuit boards having large components thereon.

The system of the invention also allows for fast and easy change of probe plates to accommodate varying types of printed circuit boards. Also, the vertical positioning and movement of the upper probe plate can be very closely controlled. In preferred embodiments a board can be staged while another board is being tested.

BRIEF DESCRIPTION OF THE DRAWINGS

The invention is described in more detail hereinafter with reference to the accompanying drawings, wherein like reference characters refer to the same parts through the several views and in which:

FIG. 6 is an exploded view of one embodiment of cassette system for probe plates useful in the system of this invention;

FIG. 7A is a front elevational view of the upper probe plate, only supported by the upper section of the test fixture;

FIG. 7B is a perspective view illustrating the latch strip system used in the present invention;

FIG. 8 is a front elevational view of a portion of the board handling system of FIG. 1 prior to insertion of probe plate cassette;

DETAILED DESCRIPTION OF THE INVENTION

Figure 1:
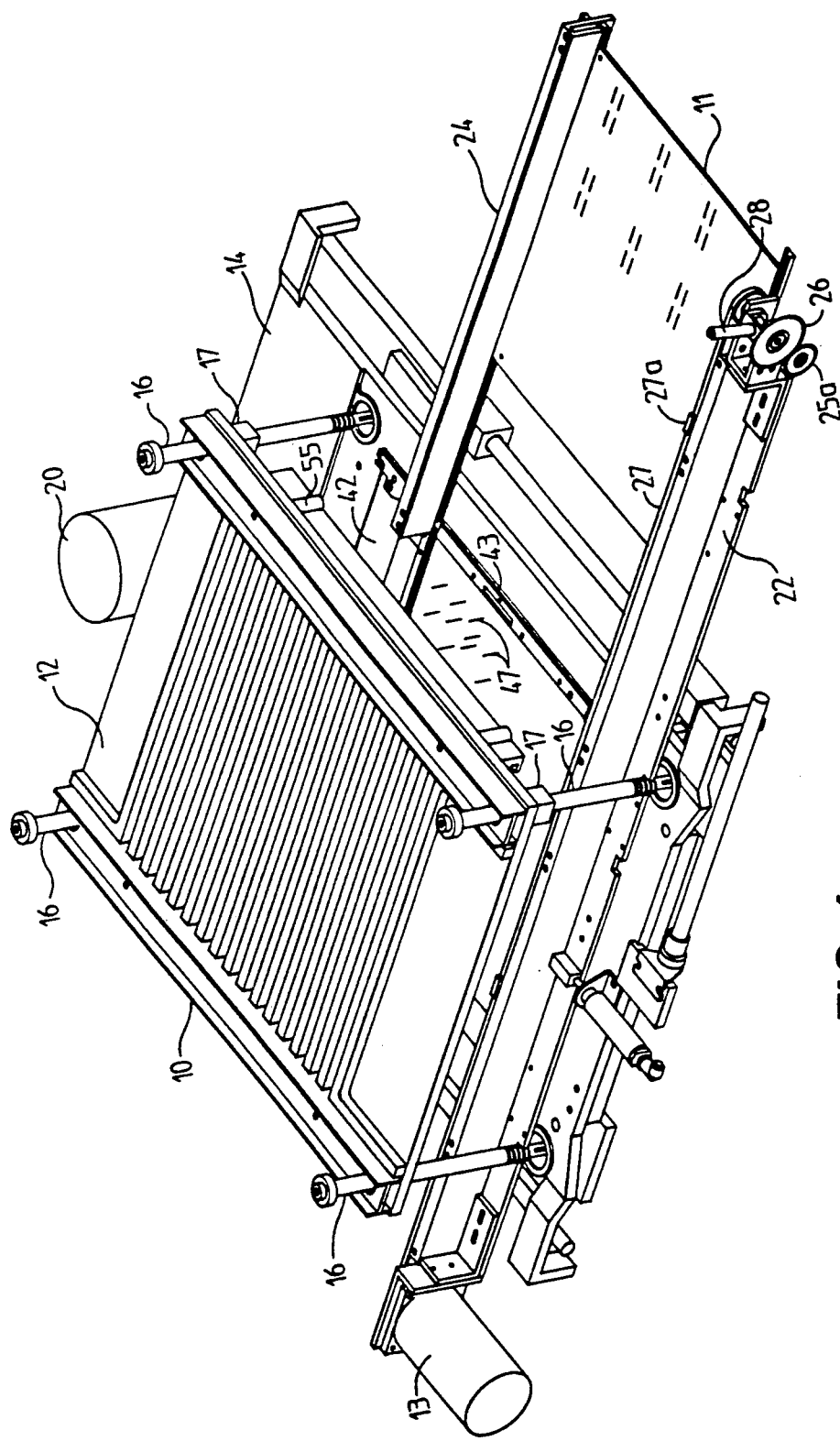
FIG. 1 is a perspective view of one embodiment of fixturing apparatus of this invention without probe plates inserted therein.

In FIG. 1 there is shown a perspective view of one embodiment of fixturing apparatus 10 of the invention. The apparatus includes a frame having upper section 12 and lower section 14 connected at the corners by means of upright members 16. Conveyor means comprising parallel rails 22 and 24 are supported by lower section 14 of the frame. The belt 27 of the conveyor means is powered by motor 13 and is adapted to convey a printed circuit board 11 to be tested from a position outside the frame to a test position within the frame between the upper section 12 and lower section 14 of the frame member and then to a position outside the frame member again. The reference herein to "printed circuit board" is intended to include not only conventional printed circuit boards but also other types of substrates on which circuitry is carried, such as, for example, a ceramic substrate, ceramic chip, etc.

An upper probe plate (described and shown in detail hereafter) is attached to upper section 12. A lower probe plate is adapted to be supported by lower section 14. Preferably the lower probe plate is adapted to be securely and firmly attached to a support structure. For example, when the test fixture is positioned and supported on a test head it is secured to the test head. Then the lower probe plate is detachably secured to the test head when the lower probe plate is placed into proper position for testing.

Each probe plate which is used in the apparatus of this invention includes probing means which are adapted to send and receive electronic signals to and from predetermined locations on the printed circuit board being tested when the board is in electrical contact with the probing means. The type of probing means used may be conventional, e.g., such as those available from Pylon, QA Technology, Contact Products, etc.

The upper probe plate is adapted to be lowered and biased against the upper surface of a printed circuit board being tested. In the embodiment shown in FIG. 1 the upright members 16 are threaded along substantially their entire length and are each rotatably supported in a bearing carried by lower section 14 of the frame. The upper section includes threaded holes in blocks 17 in which the threaded upright members are received. Thus, when the upright members are rotated in one direction the upper section 12 is lowered, and when the upright members are rotated in the opposite direction the upper section is raised. This is illustrated and explained in more detail hereafter in connection with FIG. 2.

In this manner the upper probe plate is lowered into position over the printed circuit board to be tested. With further rotation of the upright members the probing means on the upper probe plate may be pressed against the board to be tested with any desired degree of probe deflection to assure good contact between the probing means and the board being tested. One manner of assuring good contact between the probing means and the board is to lower the upper probe plate to a predetermined position which is a defined distance away from the lower probe plate. The defined distance is such that the probing means of the upper plate will firmly contact the desired contact areas on the top of the printed circuit board and the probing means of the lower plate firmly contact the desired contact areas on the bottom of the board.

Although FIG. 1 illustrates fixturing apparatus in which both upper and lower probe plates may be used, for testing certain types of printed circuit boards it may only be necessary to have one probe plate (which may be an upper or a lower probe plate). It is also possible for the probe plates to be oriented in vertical planes instead of horizontal planes as illustrated in FIG. 1. It is also possible to have the upper plate supported in a stationary position while the lower plate is movable vertically. Alternatively, it is possible for both plates to be movable vertically.

The system is adapted to very accurately control the position of one probe plate relative to the other. For example, when the lower plate is stationary and the upper plate is movable, the upper plate may be moved to a position which is a predetermined distance from the lower probe plate. This results in the probing means being deflected a desired, controlled amount. This is an advantage over the use of air pressure to urge the probe plate into contact with the board because in our system the probing means always makes firm contact with the board, and the degree of deflection of the probing means remains the same from one board being tested to another.

The board handling system may be adapted to test boards having various size components thereon. For example, the board handling system can accommodate boards for testing even where the component heights are four inches or more.

The system is also adapted to perform two level (i.e., dual stage) probing for (a) incircuit testing (i.e., testing within a circuit to determine correct component placement, performance and orientation), and (b) functional testing (i.e., testing a circuit to determine whether it performs the proper function). This is described and illustrated in more detail hereafter.

An RS-232 link preferably exists between the tester and the board handling system. The link is used to download the operating environment to the board handling system. The link is also used to input data regarding the type of board being tested. This data includes, for example, maximum component height, the distance travelled by the conveyor belt after the board has passed over an optical beam sensor, and probing heights required for multiple stage probing. The board handling system can communicate to the controller regarding proper position of the board, proper orientation of the board, etc.

The board handling system of the invention is adapted to move a printed circuit board from a production or assembly conveyor or printed circuit board magazine to a position over the test head of an incircuit or functional tester. Once the board is in the test fixture the probe plates make appropriate contact with the board to perform any necessary testing. After the testing the conveyor transports the board outside the fixture (e.g., to a position on the opposite side of the fixture or to a position on the same side as it started from).

This board handling system can also be used for manual loading of boards to be tested, if desired. In the manual mode the operator can load the board into the pre-stage area of the conveyor, i.e., the board is inserted into the outer end of the conveyor, and the conveyor moves the board into the test fixture for testing. After the testing the board can either be brought back to the pre-stage area for removal by the operator or the board can exit from the side of the fixture opposite the pre-stage area.

Figure 2:
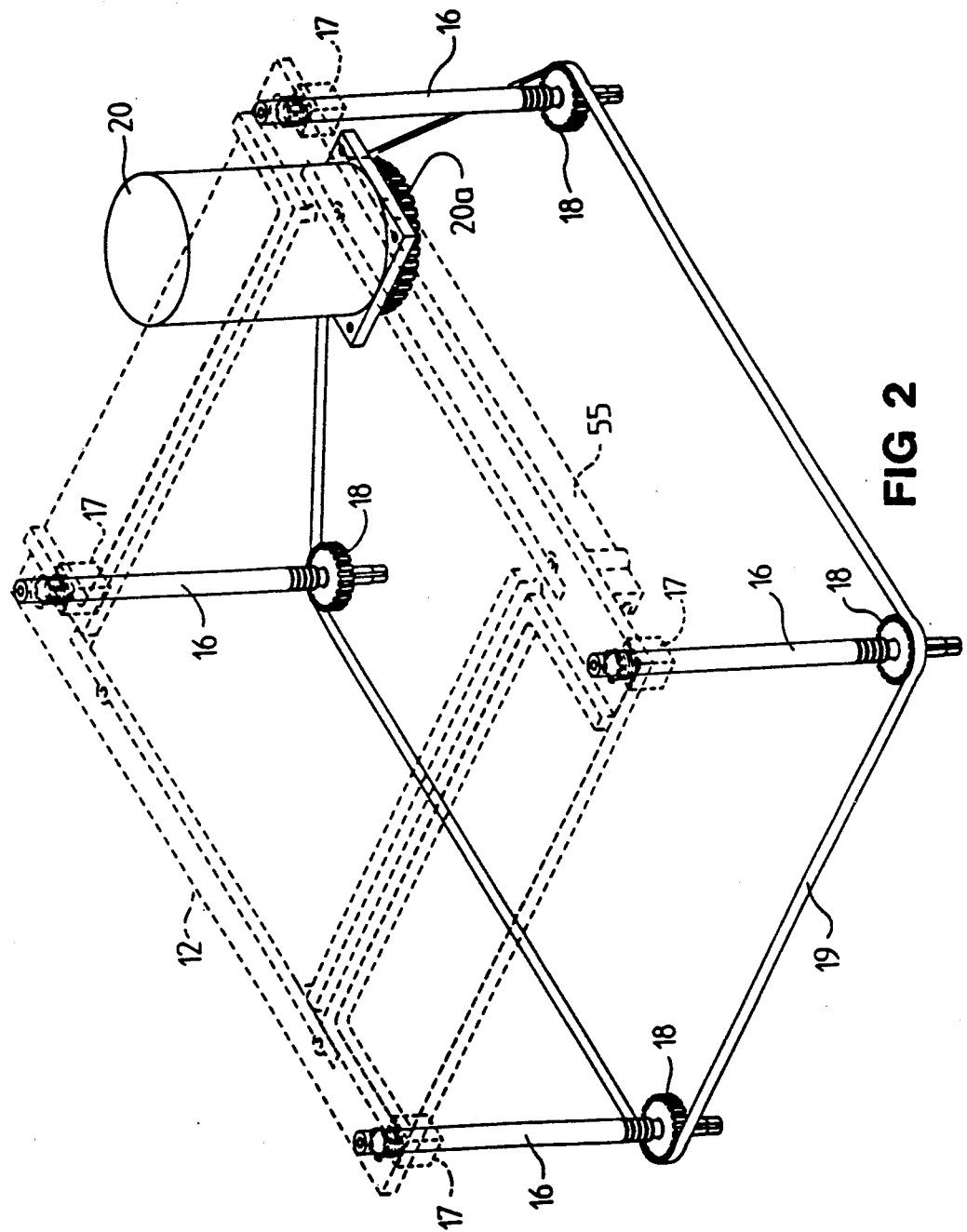
FIG. 2 is a perspective view illustrating the manner in which the upper section of the fixture (which is adapted to hold the upper probe plate) is adapted to be moved vertically in the fixture.

FIG. 2 illustrates a perspective view of a preferred manner in which the upper probe plate is adapted to be moved vertically in a very precise and controlled manner. The upper section 12 (shown in dotted lines) of the fixture is supported on upright members 16 which are threaded along substantially their entire length. The lower end of each upright member 16 is rotatably supported by the lower section (not shown) of the fixture. The upper end of each upright member threadably engages a block or housing 17 carried by the upper section 12.

The lower end of each upright support member 16 has attached to it a gear 18. An endless belt 19 is trained about each gear 18 as well as gear 20a of upper motor 20, as illustrated. Thus, as the stepper motor drives gear 20a, and hence belt 19, all of the upright support members 16 rotate in the same direction and in the same amount. Consequently, the upper section 12 (and the probe plate carried by it) is moved vertically in a controlled manner. By programming the number of steps of motor 20, it is possible to very precisely determine and control the exact vertical position of the upper probe plate relative to the lower probe plate.

Figure 3:
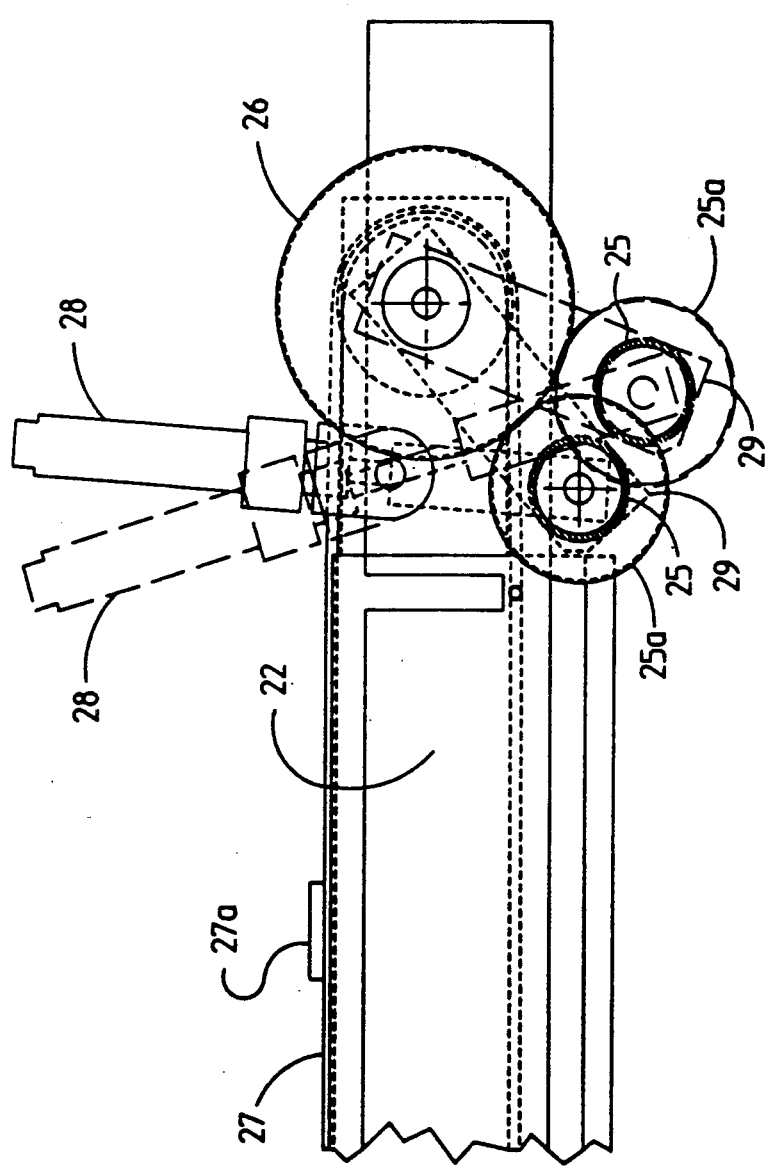
FIG. 3 is a side elevational view illustrating the operation of a pinch wheel assembly for advancing a board into the conveyor means.
Figure 4:
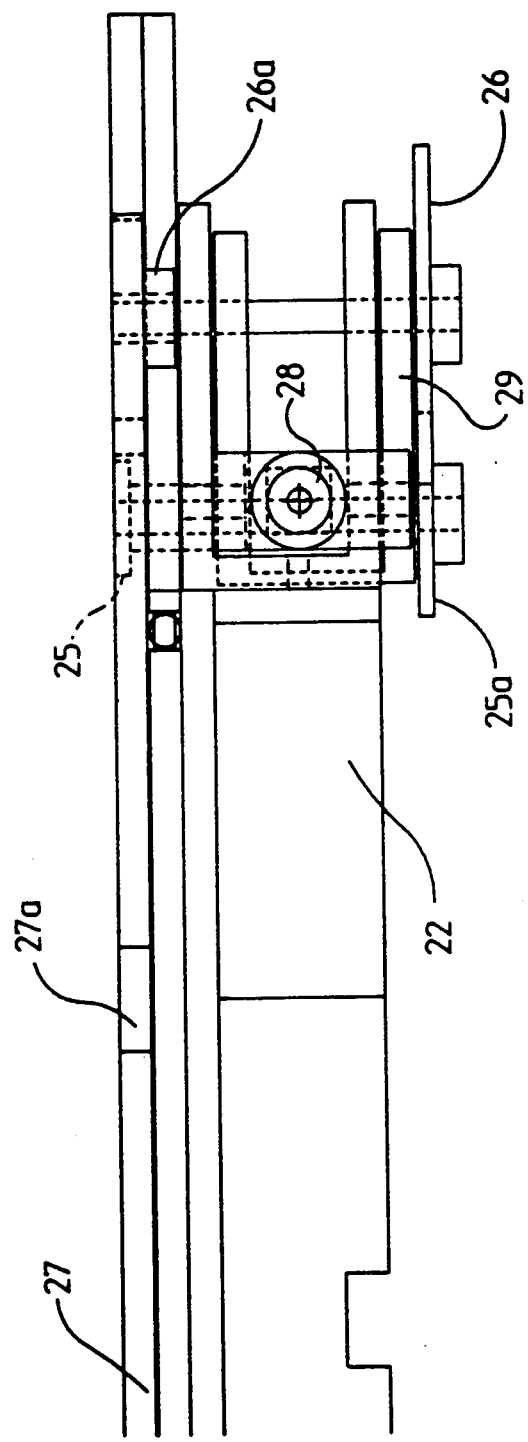
FIG. 4 is a top view of the assembly of FIG. 3.

In FIG. 3 there is shown a side elevational view of a pinch wheel mechanism at the outer end of one rail 22 of the conveyor means. FIG. 4 is a top view of the mechanism. The pinch wheel mechanism includes pinch wheel 25 rotatably carried at the end of pivotable arm 29. Gears 26 and 25a engage and drive the pinch wheel 25. Conveyor belt 27 drives gear 26 via sprocket 26a. Air-powered solenoid 28 is adapted to pivot arm 29 between downward and upward positions. The upward position of pinch wheel 25 is shown in solid lines, and the downward position is shown in dotted lines.

In a preferred embodiment of the conveyor system an optical beam (i.e., a light beam or photosensor 34) senses the leading edge of a printed circuit board being fed to the outer end of the conveyor. When the leading edge of the board breaks the light beam the air solenoid 28 is activated. This causes the pinch wheel 25 to be raised to its upward position where it contacts the bottom of the board at one edge and urges the board upwardly against the conveyor belt 27.

Then the conveyor belt is programmed to start moving. As the belt moves this drives gear 26 and hence pinch wheel 25. When the rear edge of the board passes over and past the pinch wheel the board is no longer driven by the pinch wheel. The conveyor belt keeps moving but the board is not engaged at this point. When a raised tab or protrusion 27a on the surface of the conveyor belt catches the rear end of the board, then the board is moved along the conveyor toward the test fixture. As an alternative embodiment, the pinch wheel is not driven but rather it rotates freely. When it is urged upwardly against the board it also urges the board tightly against the belt 27 which moves the board along the conveyor due to frictional engagement between the belt and board.

When the rear end of the board passes through the optical beam sensor 34 the exact position of the board in the conveyor is known. Then the steps of the stepping motor driving the conveyor may be counted to monitor the position of the board.

The optical sensor preferably is an optical interrupter comprising a fiber optic LED and phototransistor in a plastic package. Fiber optics are attached to the rail 22 of the conveyor with a space between the transmitter and the receiver fibers through which the board may pass. When a board to be tested passes through the sensor the optical path of the interrupter is broken, which determines the board position.

In another preferred embodiment there is another optical beam sensor 35 farther along the conveyor at a point prior to when the board enters the test fixture. This sensor picks up information from the board which allows a microprocessor to determine (a) whether the board is correctly oriented in the conveyor (i.e. whether the board is in backward or upside down), and (b) whether the correct probe plates for this particular board are in the fixture. For example, the optical sensor may read a pattern of holes along one edge of the board. The sensor may also identify the board by measuring its length, or measuring the distance from the edge of the board to a hole or slot on the side of the board, etc.

Figure 5:
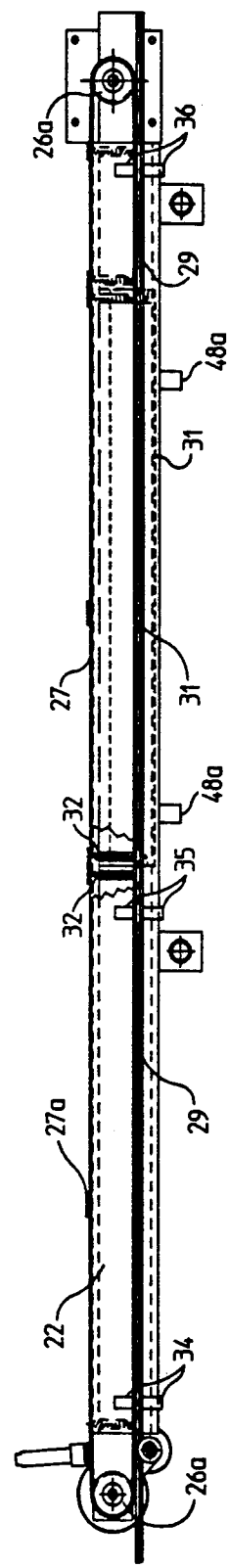
FIG. 5 is a side elevational view illustrating one embodiment of conveyor means useful in this system.
Figure 5A:
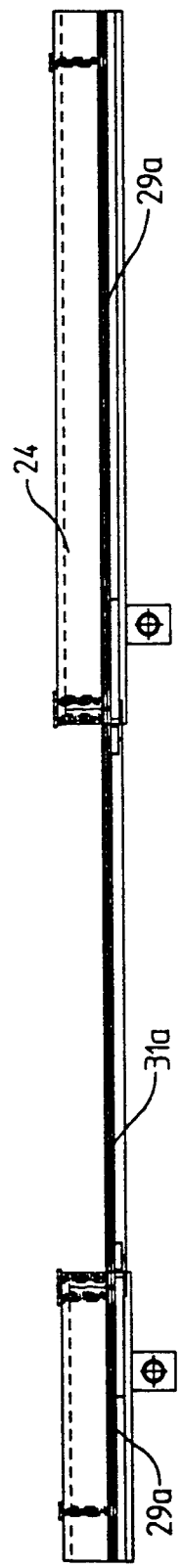
FIG. 5A is a side elevational view of one rail of the conveyor system used in the embodiment of FIG. 1.

Further details of rail 22 of the conveyor system are illustrated in FIG. 5. The conveyor belt 27 is trained about sprockets 26a at opposite ends of the rail 22. Beneath belt 27 is shelf 29 which extends along the length of rail 22. The edge of the board being transported is adapted to be received in the space defined between the shelf 29 and the surface of the belt 27. The shelf supports the edge of the board. The other rail 24 also includes a corresponding shelf to support the opposite side edge of the board as it is conveyed along the conveyor. See FIG. 5A. A tab 27a on belt 27 on rail 22 urges the board along the conveyor.

The shelf 29 of rail 22 includes at least one section 31 which is vertically displaceable. Preferably there are a plurality of such sections in end-to-end arrangement. These sections 31 are biased to a normally upward position (e.g. by means of springs 32) but they can be displaced downwardly so that the board is disengaged from the belt 27. Rail 24 also includes a corresponding shelf 29a, a vertically displaceable section 31a, and springs 32a which operate in the same manner as described with respect to rail 22.

When a board is in proper position over the lower probe plate the belt 27 is stopped and the upper section 12 of the fixture is caused to be lowered, where it is urged against the top surface of the board. As the upper section 12 is lowered further it pushes the board downwardly against section, or sections, 31 (depending upon the length of the board relative to the length of each section 31) which causes them to be displaced downwardly until the bottom surface of the board is in contact with the probing means of the lower probe plate. A separate optical sensor determines a zero or null position for the moving probe plate, i.e., the upper probe plate. From there a program instructs the stepper motor 20 to move a predetermined number of steps to lower the probe plate a defined distance to a desired position relative to the lower probe plate. Push rods on the upper probe plate push the board down against the lower probe plate in FIG. 1.

While one board is being tested in the fixture, it is possible to pre-stage another board in the conveyor to be ready for testing. This is effected by advancing another board into the outer end of the conveyor as previously described in a manner such that a tab 27a of belt 27 engages the rear edge of the board and moves it toward the test fixture to a predetermined location (i.e., a position determined by instructing the motor driving belt 27 to advance a predetermined distance after the rear edge of the board passes photosensor 34).

After the first board has been tested, the stepper motor 20 is activated and the upper probe plate is raised a defined distance to a predetermined position, thereby allowing the sections 31 and 31a to raise the edges of the board so that tab 27a of belt 27 engages the board again. The belt 27 then starts moving forwardly again and conveys the board out of the test fixture and simultaneously moves the pre-staged board into the fixture for testing. Optionally, another optical beam sensor 36 can be included to determine that the board which was tested was in fact conveyed out of the fixture. This procedure is repeated for all boards of the same type to be tested.

When no more boards of the same type remain to be tested, and a different type of board is to be tested, a preferred manner of operating is as follows:

1. The microprocessor is instructed that a different type of board is to be tested.
2. The process control computer or operator determines what type of probe plates are required.
3. The microprocessor instructs the rails of the conveyor system to retract, i.e. to move away from each other along the rail supports. The rails are preferably moved by means of compressed air.
4. The upper section of the fixture is lowered until the posts of the upper probe plate become latched with the latch system on the lower probe plate (illustrated in FIGS. 6, 7 and 7A) to form a cassette.
5. The probe plate cassette is released from the test head and raised.
6. The probe plate cassette is taken out of the fixture.
7. The new probe plate cassette is placed in the fixture.
8. The upper section of the fixture is lowered so that the cassette moves downwardly until it is clamped in place on the test head.
9. When the lower probe plate is in the desired position the rail 22 of the conveyor system is moved inwardly toward the lower probe plate to release a latch mechanism which holds the lower probe plate to the upper probe plate.
10. The upper probe plate is raised.
11. The other conveyor rail moves toward the first rail until it reaches a mechanical stop member carried on the lower probe plate which defines the board width for boards to be tested by the new probe plate system.

Preferably, rail position sensors are used to sense that the rails of the conveyor are in proper position after opening for probe plate loading and then closing again. A fiber optic sensor on rail 22 and a blade on the frame will determine when the rail is in fully open position for probe plate loading and closed for testing purposes. A fiber optic sensor on rail 24 and a blade on the lower probe plate will determine when the rail is against the mechanical stops on the probe plate. A blade is also on the frame to verify when the rail 24 is in fully open position. With respect to the operation of both sensors, each blade has an aperture in it so that the sensor will go through a dark-light-dark transition. This pattern will verify that each rail is in the open position and not stuck in the closed position.

In FIG. 6 there is shown an exploded view of one embodiment of cassette system for the probe plates. The upper probe plate is designated as 40 and the lower probe plate is designated as 42.

The upper probe plate includes downwardly extending posts 41 on opposite side edges. These posts are adapted to be slidingly received in and engaged by latch means carried by the lower probe plate. In the embodiment shown in FIG. 6 there are two latch plates 43 along opposite side edges of the lower probe plate. Each latch plate includes apertures 44 which are located so as to receive posts 41 when the upper and lower probe plates come together. Latch plates 43 are secured to lower probe plate 42 by means of brackets 43a.

FIG. 7A is a front elevational view of an upper probe plate 40 showing the depending posts 41. The outer end 41a of each post 41 is tapered. Just above the tapered end is a groove or channel 45 on each post 41 which preferably extends completely around the post, i.e., preferably it is a continuous annular groove.

In FIG. 7B there is illustrated a latch strip which is disposed beneath each latch plate 43. The latch strip comprises spaced-apart, parallel cantilever strip members 48. When the posts 41 of the upper probe plate are urged downwardly through apertures 44 in the latch plate 43, the tapered end 41a of each post 41 passes between the spaced apart strip members 48 and deflects them even further apart until such strip members are able to spring back towards each other into groove 45 of post 41. At that point the posts 41 are latched to the latch strip. Latch plate 43 prevents the cantilever strips from being deflected upwardly when the upper probe plate is lifted, i.e., the upper and lower probe plates are effectively locked together. The angle of the taper at end 41a affects the insertion force of post 41 into the strip members 48.

Figure 7:
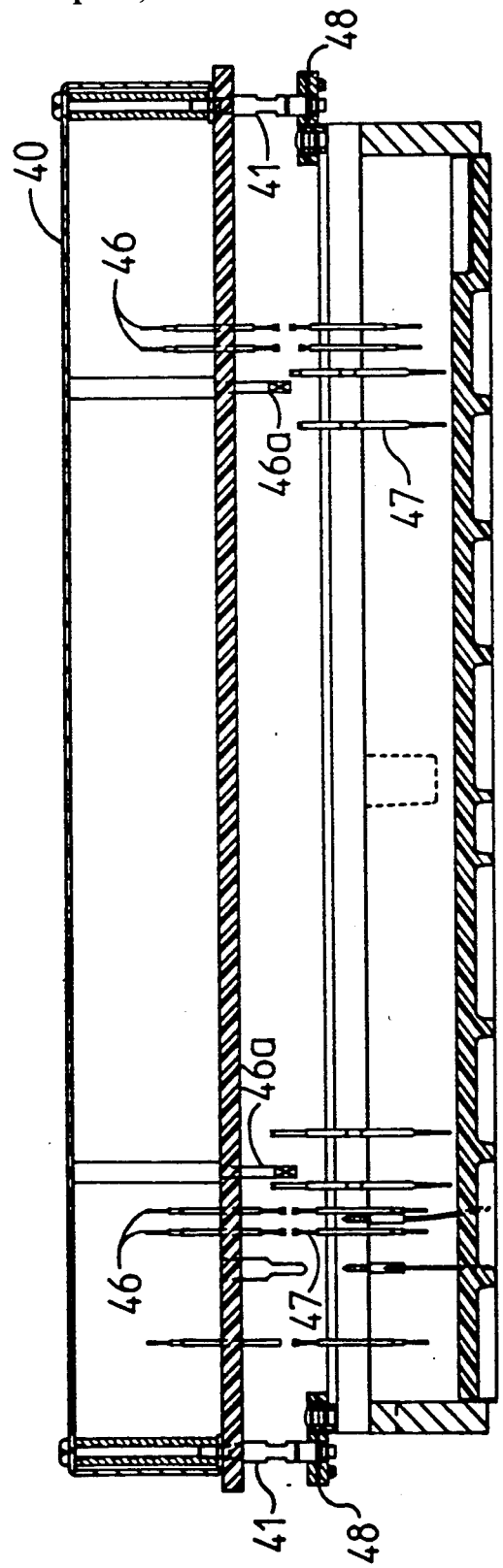
FIG. 7 is a front elevational view of a cassette system of the invention showing two probe plates interconnected.

FIG. 7 is a front elevational view of a cassette system showing upper probe plate 40 latched to a lower probe plate 42 by means of posts 41 and latch strip 48. FIG. 7 illustrates how the probes 46 and pushers 46a of the top probe plate 40 are spaced above and prevented from touching the probes 47 of the lower probe plate 42.

In order to detach the lower probe plate 42 from the upper plate 40 the latch strip 48 may be moved horizontally under the latch plate until section 49 of the latch strip reaches post 41. Section 49 is a portion of the latch strip where cantilever strips 48 are spaced from each other a distance at least equal to the diameter of post 41, whereby the strips 48 are released from groove 45 in post 41. On each latch strip there is one such section 49 corresponding to each post 41 of the upper probe plate. When section 49 of the latch strip is aligned with post 41, the post may be moved vertically away from the latch strip.

One manner of moving the latch strip 48 is by means of tabs 48a carried by rail 22. When rail 22 is positioned against the lower probe plate, the tabs 48a are urged against the end of each latch strip 48 to thereby move the latch strip to a position where each section 49 is aligned with a post 41. This allows separation of the post 41 from the latch strip 48.

FIG. 8 illustrates a front elevational view of a portion of the board handling system of FIG. 1 prior to insertion of a probe plate cassette. Suspended from the upper section 12 are L-shaped ledges or shelves 55 on opposite side edges. The side edges of the upper probe plate are adapted to slide over and be supported on shelves 55. Hemispherical pins 56 in ledges 55 are adapted to engage holes in the underside of the edges of the upper probe plate. The hemi-spherical pins serve to align the cassette assembly with the upper section 12 to an approximate position.

Figure 9A:
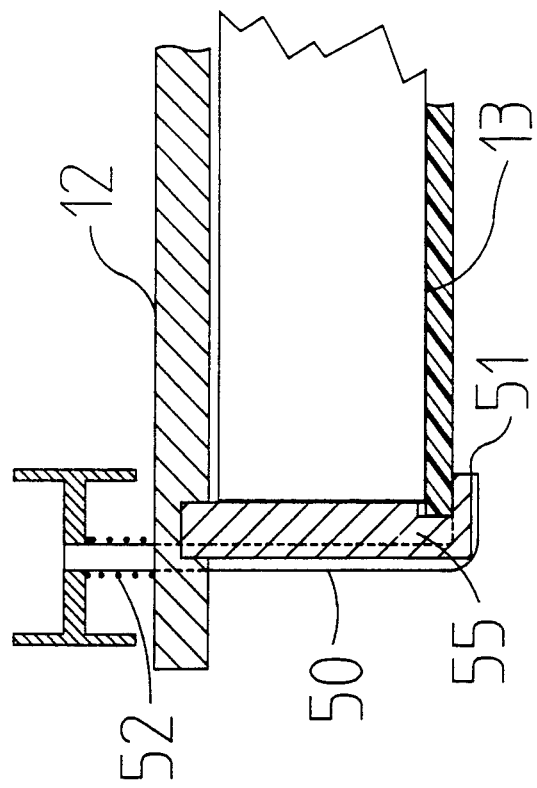
FIGS. 9A and 9B illustrate one manner of locking the cassette into place in the board handling fixture of the invention.
Figure 9B:
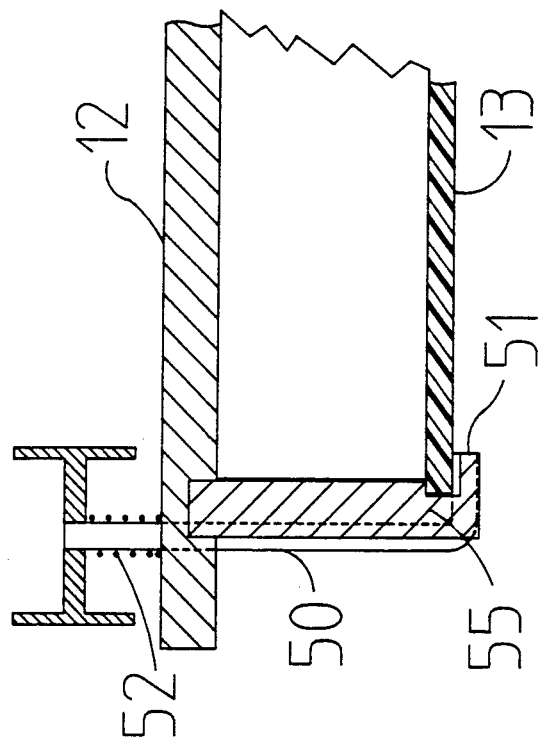
Figure 9C:
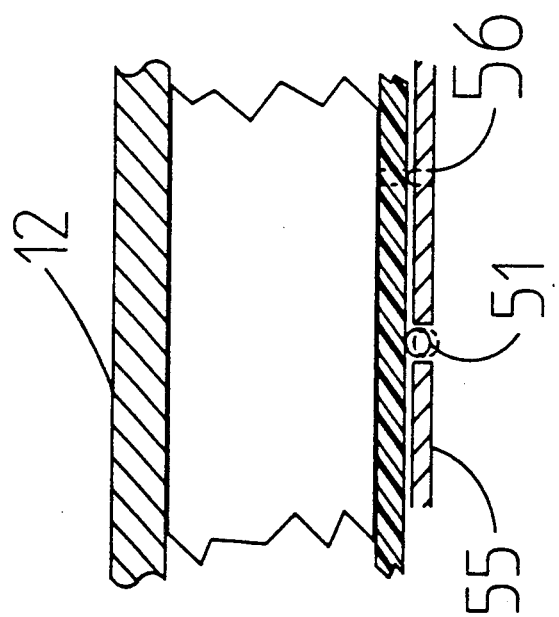
FIG. 9C is a side elevational view illustrating one manner in which the L-shaped pin clamps the cassette to the upper section of the fixture.

FIGS. 9A, 9B and 9C are fragmentary views illustrating one manner in which the upper probe plate 13 may be detachably secured to the shelves 55 of the upper section 12 of the fixturing system. An L-shaped pin 50 is suspended from the upper section 12. The lower end 51 of pin 50 is bent perpendicularly to the main shank of pin 50, as illustrated. End 51 is adapted to be received in an appropriately shaped groove or notch in shelf 55. When upper section 12 is raised to its upper most position, spring 52 is compressed, allowing pin 50 to move downwardly and out of the groove or notch in shelf 55. This enables the upper probe plate to slide in or out on shelf 55 unimpeded.

After the upper probe plate has been fully inserted onto shelf 55 the upper section 12 may again be lowered. This enables end 51 of pin 50 to proceed upwardly in the notch in shelf 55 and then engage the underside of the upper probe plate. This clamps the upper probe plate to the upper section 12 and disengages the probe plate from the spherical pins 56. FIG. 9C is a side elevational view showing end 51 of pin 50 in its upper and lower positions.

Figure 10:
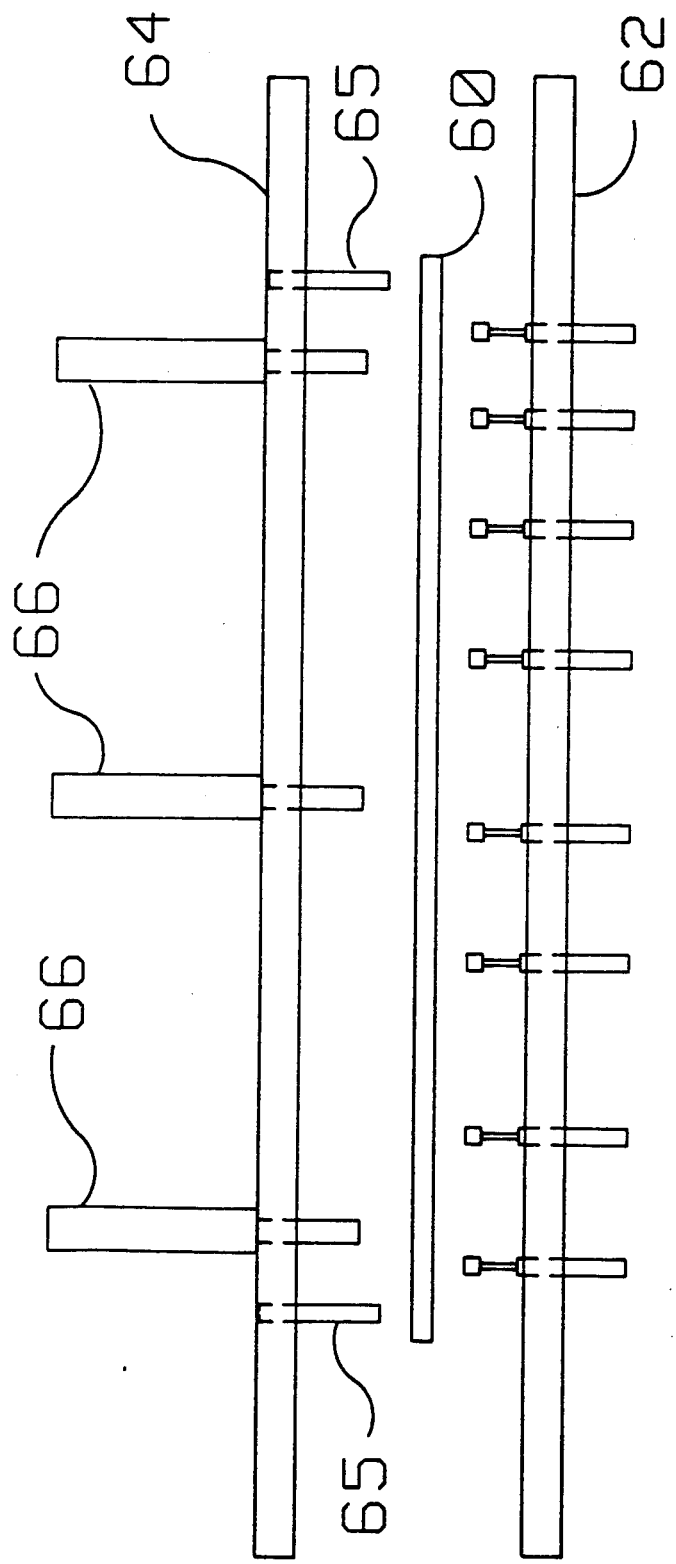
FIG. 10 illustrates a board positioned over a probe plate prior to testing in one embodiment of the system of this invention.
Figure 11:
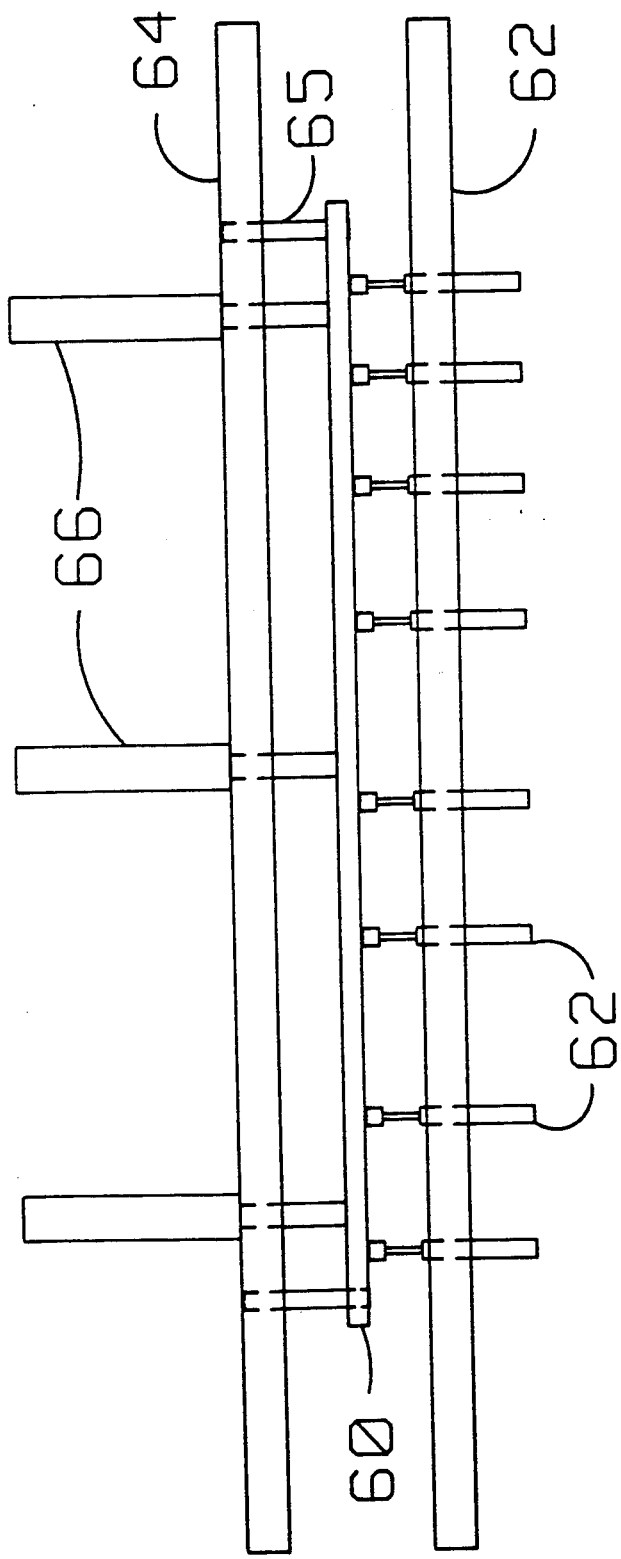
FIG. 11 illustrates the board of FIG. 10 during testing.

Instead of having the probe plates be removable from the fixture as illustrated and described above, it is of course possible to have them permanently mounted to the fixture, if desired. Also, if desired, the probe plates may be adapted to be separately removable from the fixture FIG. 10 illustrates a board 60 to be tested positioned over a probe plate 62 having probing means 63 thereon. Upper plate 64 in this example does not contain any probing means but it does carry reference or alignment pins 65 and pushers 66. As the upper plate 64 is moved downwardly the reference pins 65 engage appropriate apertures or tooling holes in board 60 and keep the board in proper alignment for presentation to the probe plate 62. Then as the upper plate moves down farther the pushers 66 carried by the upper plate urge the board firmly into contact with the probing means 63, as illustrated in FIG. 11. To assure firm contact between the board and the probing means the upper plate 64 is moved downwardly to a specific, predetermined distance from the lower plate 62. The posts 41 of the upper probe plate (described above in connection with FIGS. 6, 7, 7A and 7B) serve to maintain alignment between the upper and lower probe plates.

Figure 12:
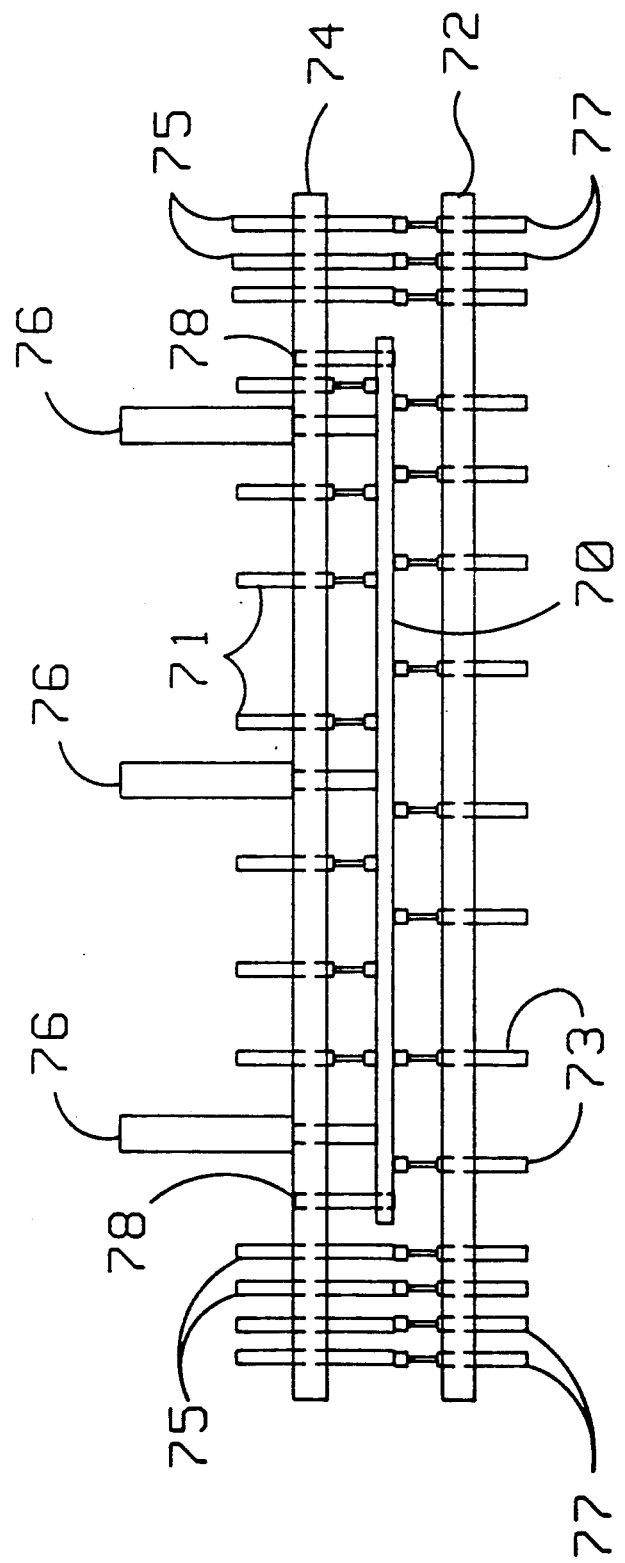
FIG. 12 illustrates a board positioned between two probes and being tested (dual sided probing)

FIG. 12 illustrates a board 70 being tested on both top and bottom sides in the test fixture of the invention. The upper probe plate 74 includes probing means 71, pushers 76, reference pins 78, and transfer pins 75. The lower probe plate 72 includes probing means 73 and transfer pins 77. The transfer pins 77 of the lower plate 72 align with the transfer pins 75 of the upper plate 74 and serve to transfer appropriate electrical signals from the lower plate to the upper plate. The transfer pins 75 are connected to the upper probing means 71 using wire wrapping techniques.

The force exerted by the lower probes 73 on the board 70 must be greater than the force exerted on the board by the upper probes 71. When this condition is met the pushers 76 will determine the plane of the board.

Instead of using transfer pins to transfer electrical signals from the lower probe plate to the upper probe plate it is possible to have the upper probe plate wired separately and directly. However, when using the cassette system described above for the probe plates, it is simpler to use transfer pins, as described.

In another variation, it is possible to have probing means only on the upper plate when single side probing is being done. In such case the lower plate may include transfer pins for transferring electrical signals to the upper probe plate and spring pushers or stops to bias the board against the pusher rods.

Figure 13:
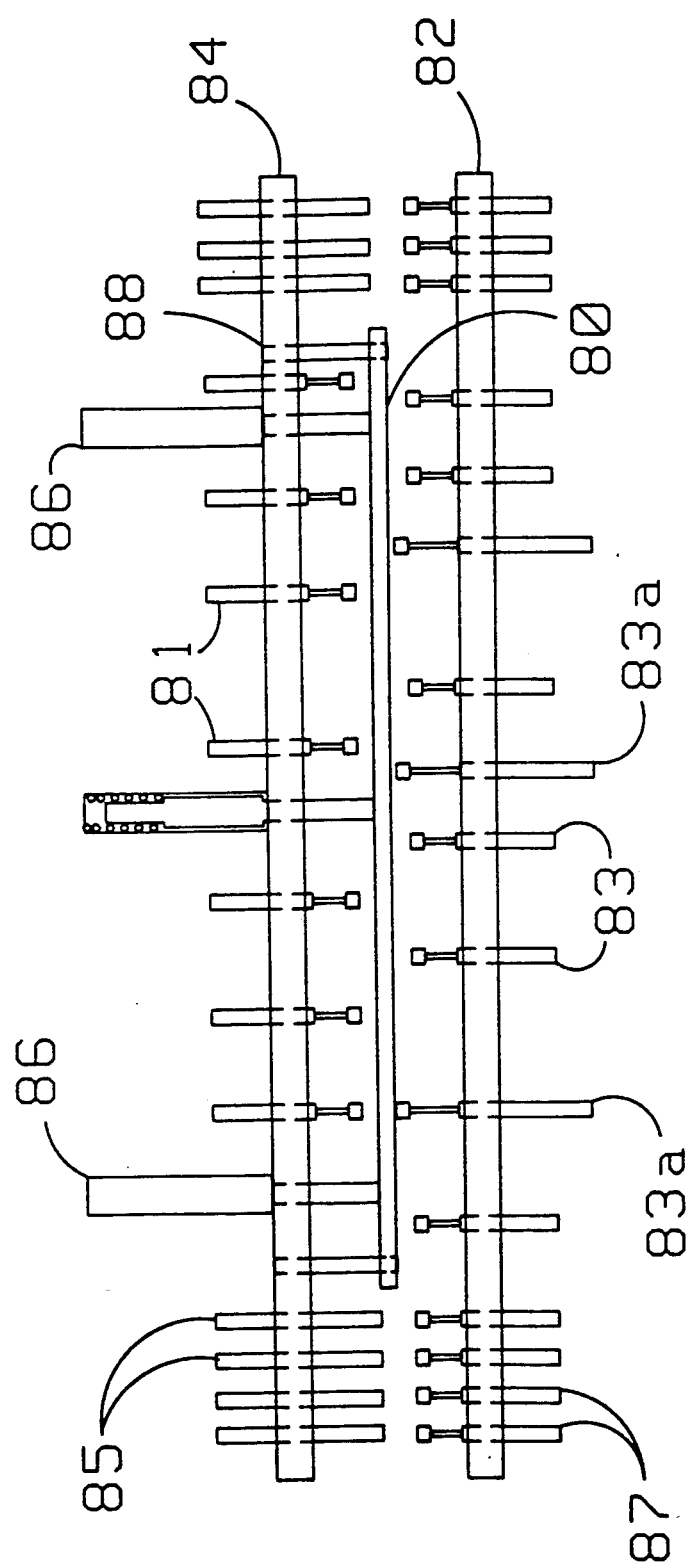
FIG. 13 illustrates a board positioned between two probe plates and being functionally tested.

FIG. 13 illustrates a board 80 between upper probe plate 84 and lower probe plate 82. Upper plate 84 includes dual stage pushers 86, probing means 81, reference pins 88 and transfer pins 85. Lower plate 82 includes transfer pins 87 and two types of probing means. Probing means 83a are dual stage probes which are useful for functional testing of the board when the board is in the position shown in the drawing. Probing means 83 are used for incircuit testing when the board 80 is biased downwardly against such probing means (as illustrated in FIG. 14).

Figure 14:
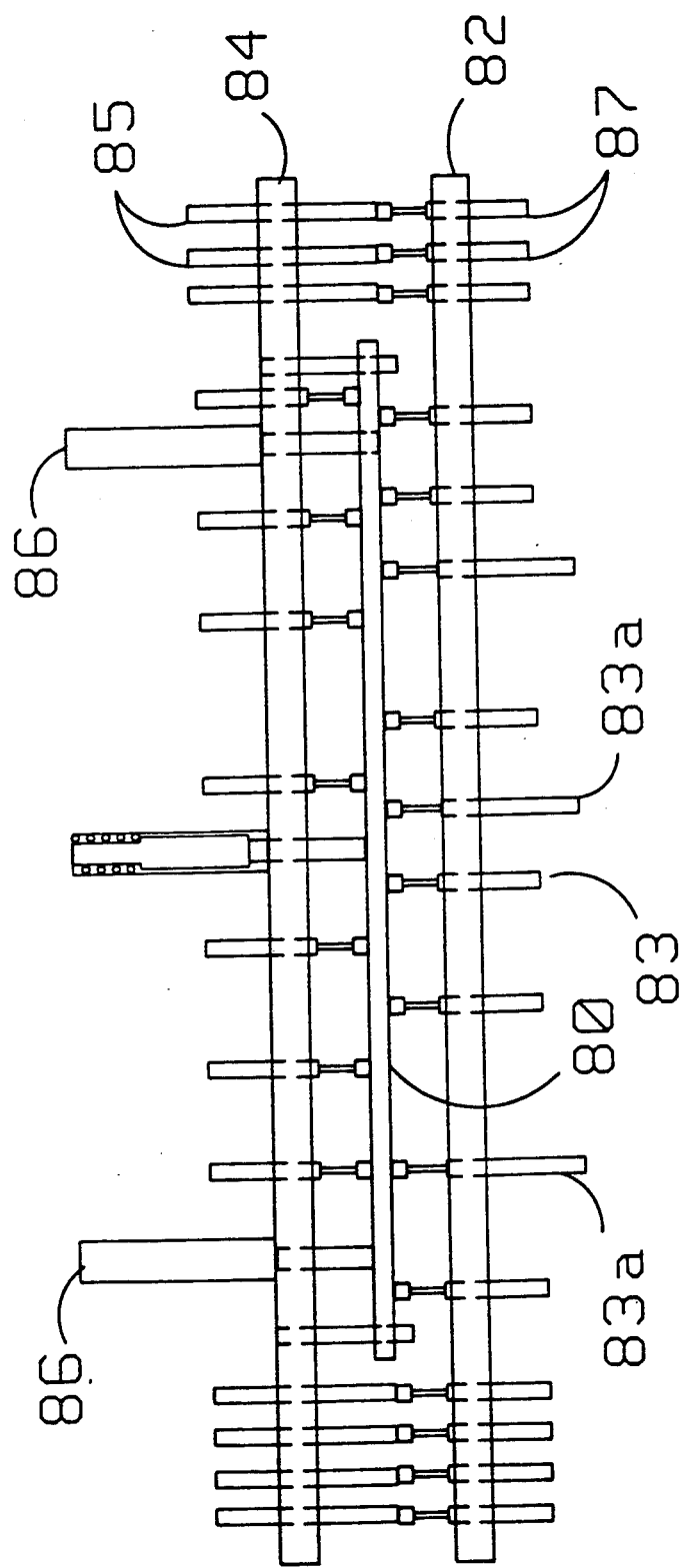
FIG. 14 illustrates the board of FIG. 13 being incircuit tested in the system.
Figure 15:
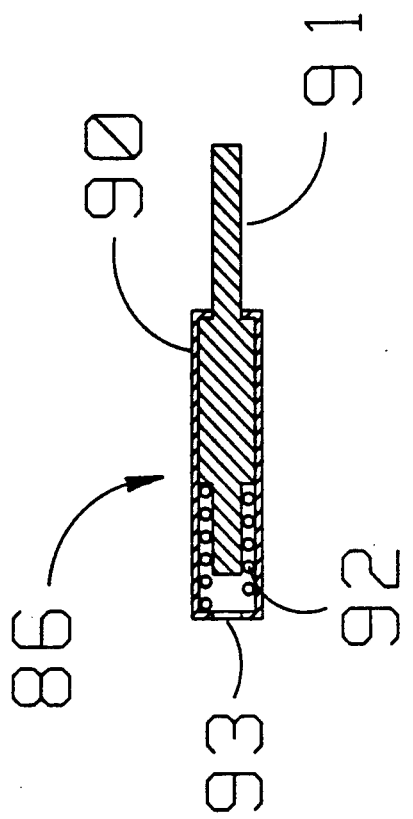
FIG. 15 is a cross-sectional view of one embodiment of dual stage pusher useful in the system of the invention.

FIG. 15 is a cross-sectional view of one embodiment of dual stage pusher 86 which is useful in the embodiment shown in FIGS. 13 and 14. The pusher 86 includes barrel portion 90, plunger portion 91, and spring 92. The spring biases the plunger to its normally outward position. When the force exerted against the plunger exceeds the force of the spring 92, then the plunger retracts into the barrel 90 until the inner end 93 of the plunger contacts the end of barrel 90. Then pusher 86 operates in the manner of a standard, solid pusher as it continues to be pushed against the board in the fixture.

Figure 16:
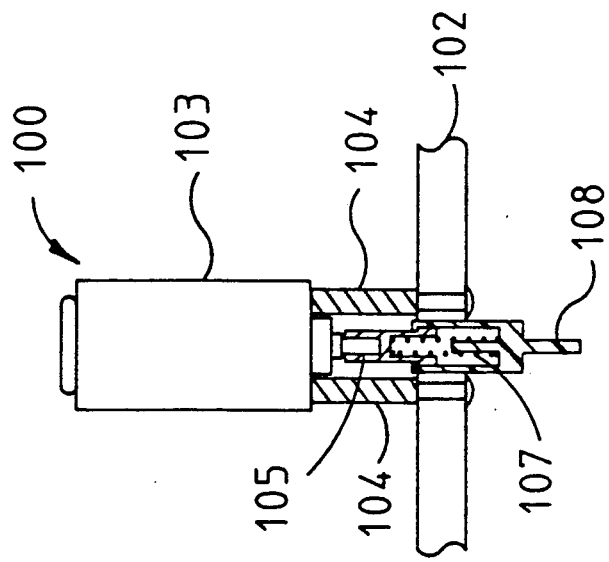
FIG. 16 illustrates a special function probe which is useful in the system of the invention.

FIG. 16 is a partial cut-away elevational view of a special type of probing means 100 which may be carried by upper probe plate 102. This type of probe is a rotary actuator which is adapted to used for rotary adjustment of variable components on a board being tested. A DC gear motor 103 is used as the prime mover. The motor is attached to the top probe plate 102 by mounting posts 104. The drive sleeve 105, spring 107, and bit 108 are coupled to the motor 103. Upon rotation of the motor and drive sleeve the bit rotates and can adjust variable components on the board. The spring 107 allows vertical motion of the bit to accommodate components of various heights on the board.

Other types of probes could be included on the upper or lower probe plate. For example, light detectors for LEDs, a capacitive probe to sense capacitor polarity, a switch actuator for keyboards, DIP switches, etc. may be included, if desired.

Figure 17:
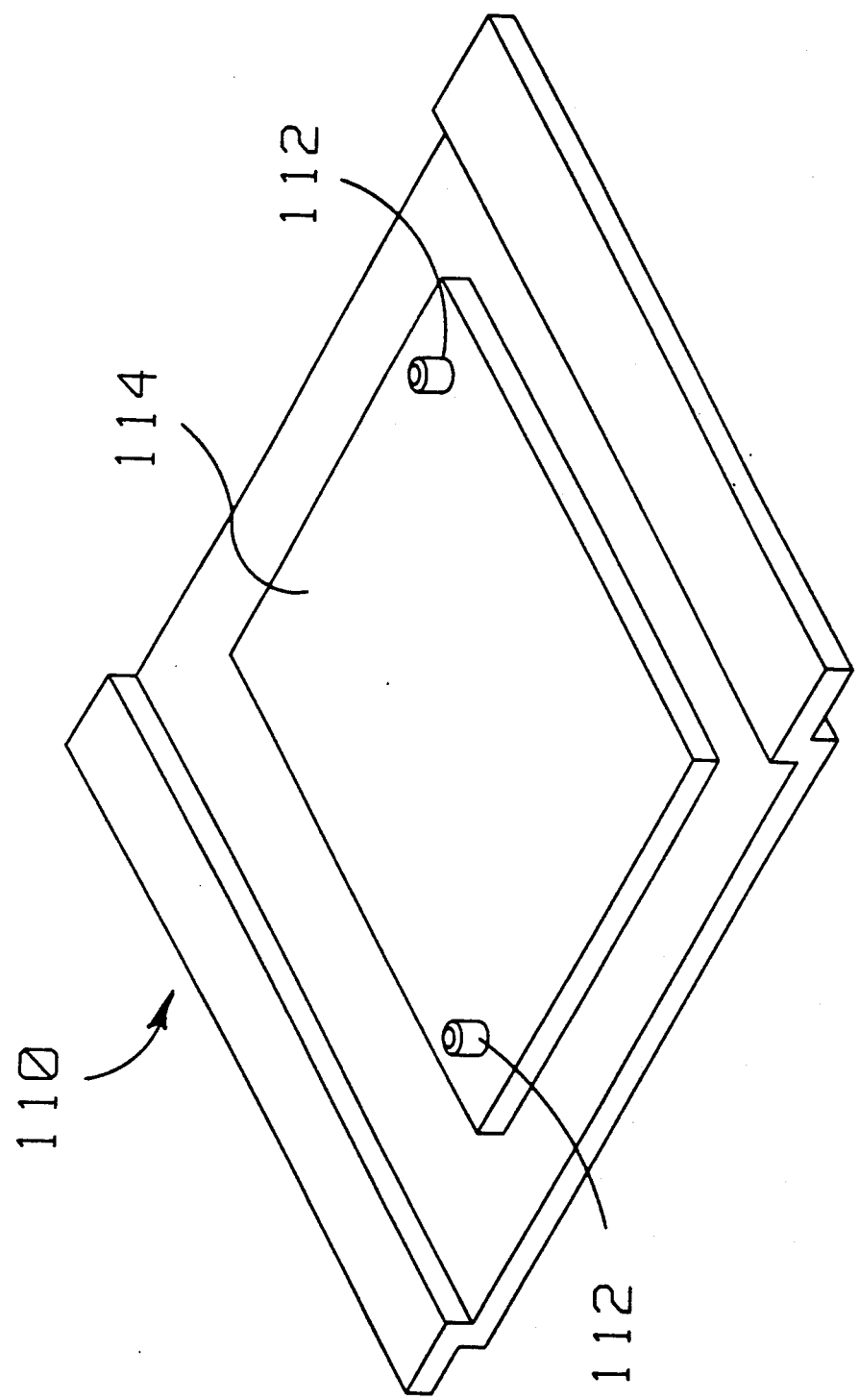
FIG. 17 illustrates a carrier which is useful in the system for handling small boards or boards with insufficient edge clearance.

FIG. 17 illustrates one form of carrier 110 which may be used in the board handling system of the invention for carrying very small boards or other boards which do not have the desired degree of clearance along their edges to permit handling by the conveyor means. The carrier 110 which is illustrated is made of sheet metal or other rigid material and includes reference pins 112. A board 114 having apertures therethrough corresponding to the reference pins is placed on the carrier and is maintained in proper alignment thereon by reason of the reference pins. Then the carrier may be handled by the conveyor means in accordance with the procedures described above for proper testing of the board 114.

The board handling system of the invention can be adapted to handle boards of a wide variety of sizes (e.g., from as large as 16 inches by 18 inches or larger down to 2 inches by 5 inches). Of course, for very small boards a carrier such as shown in FIG. 17 may be used.

To protect against possible damage or injury caused to an object inserted between the probe plates during testing, an intrusion sensor may be employed. For example, a light curtain may be provided to disable the test fixture if an object blocks the light. It is also possible to provide a cover or housing over the test fixture with a sensor or interlock on the door to disable the fixture when the door is open.

There may also be limit sensors on the test fixture to prevent the probe plates from coming into contact with each other and to prevent the upper probe plate from travelling too far upwardly. The limit sensors may be fiber optic interrupters. Also, there is preferably included an optical sensor to verify that the lower probe plate is in proper position prior to testing.

Other variants are possible without departing from the scope of the present invention. For example, other types of motors may be used in place of the stepper motors referred to herein (e.g., there may be used D.C. motors or hydraulic motors).

What is claimed is:

1. A board fixturing system for interfacing a printed circuit board having electronic devices at predetermined locations thereon to a probe plate having electrical contacts at predetermined locations, said board fixturing system comprising:
    (a) a frame member;
    (b) at least one probe plate supported within said frame member;
    (c) probing means carried by said probe plate for sending and receiving electronic signals to and from predetermined locations on said board when said board is in electrical contact with said probing means;
    (d) bias means for biasing said board into contact with said probing means;
    (e) alignment means for aligning said board with said probing means;
    (f) conveyor means for engaging and transporting said board from outside said frame member to a position adjacent said probe plate; said conveyor means being further adapted to transport said board from said position adjacent said probe plate to another position outside said frame member; and
    (g) disengagement means for disengaging said board from said conveyor means when said board is adjacent said probe plate;
wherein said disengagement means comprises vertically displaceable supports beneath said conveyor means within said frame member, wherein said displaceable supports are biases to a normally upward position adjacent said conveyor means, and wherein said upper section of said frame member is adapted to urge said board downwardly in a manner such that said displaceable supports are deflected downwardly away from said conveyor means; wherein said board is disengaged from said conveyor means.

2. A board fixturing system in accordance with claim 1, wherein said probe plate is stationary.

3. A board fixturing system in accordance with claim 1, wherein said frame member comprises an upper section and a lower section, wherein said probe plate is carried by said lower section, wherein said upper section is vertically movable, and wherein said upper section includes said bias means for biasing said board into contact with said probing means when said upper section is moved vertically toward said probe plate.

4. A board fixturing system in accordance with claim 3, further comprising a second probe plate which is carried by said upper section, said second probe plate including second probing means for sending and receiving electronic signals to and from predetermined locations on said board when said board is in electrical contact with said second probing means.

5. A board fixturing system in accordance with claim 4, wherein said probe plates each include transfer pins for transferring electrical signals from one said probe plate to the other said probe plate when said probe plates are biased against said board.

6. A board fixturing system in accordance with claim 4, wherein one of said probe plates includes functional probing means for testing said board when said second probe plate is in a first position, and wherein said probe plates each includes probing means for incircuit testing of said board when said second probe plate is in a second position.

7. A board fixturing system in accordance with claim 4, wherein said probe plates are adapted to be latched together to form a cassette which is slidingly removable from said frame member.

8. A board fixturing system in accordance with claim 4, wherein one of said probe plates includes functional probing means which is adapted to test said board when said second probe plate is in each of first and second positions, and wherein said probe plates each include probing means which are adapted to provide incircuit testing of said board when said second probe plate is in a third position.

9. A board fixturing system in accordance with claim 1, wherein said conveyor means comprises first and second parallel rail members, wherein said first rail member includes a driven endless belt having a plurality of tab members thereon, wherein at least one of said tab members engages said board; and wherein said second rail member is movable relative to said first rail member in a manner such that said conveyor means can convey circuit boards of different widths.

10. A board fixturing system for interfacing a printed circuit board having electronic devices at predetermined locations thereon to probe plates having electrical contacts at predetermined locations, said board fixturing system comprising:
(a) a frame member;
(b) upper and lower probe plates supported within said frame member; said lower plate being supported in a stationary position, and said upper plate being vertically movable; wherein said probe plates are adapted to be latched together to form a cassette which is slidingly removable from said frame member;
(c) lower probing means carried by said lower probe plate, and upper probing means carried by said upper plate; each said probing means being adapted to send and receive electronic signals to and from predetermined locations on said board when said board is in electrical contact with said probing means;
(d) bias means for biasing said upper probe plate downwardly against said board in a manner such that said upper and lower probing means contact said board;
(e) alignment means for aligning said board with said upper and lower probing means;
(f) conveyor means for engaging and transporting said board from outside said frame member to a position between said upper and lower probe plates; said conveyor means being further adapted to transport said board from said position between said probe plates to another position outside said frame member.

11. A board fixturing system in accordance with claim 10, wherein said conveyor means comprises first and second parallel rail members, wherein said first rail member includes a driven endless belt having a plurality of tab members thereon, wherein at least one of said tab members engages said board.

12. A board fixturing system in accordance with claim 10, wherein said alignment means comprises a plurality of pins carried by one of said probe plates, wherein said pins engage apertures in said board.

13. A board fixturing system in accordance with claim 10, wherein said probe plates each includes transfer pins for transferring electrical signals from one said probe plate to the other said probe plate when said upper probe plate is biased against said board.

14. A board fixturing system in accordance with claim 10, further comprising disengagement means, wherein said disengagement means comprises vertically displaceable supports beneath said conveyor means within said frame member, wherein said displaceable supports are biased to a normally upward position adjacent said conveyor means, and wherein said upper probe plate is adapted to urge said board downwardly in a manner such that said displaceable supports are deflected downwardly away from said conveyor means; wherein said board is disengaged from said conveyor means.

15. A board fixturing system in accordance with claim 10, wherein said lower probe plate includes functional probing means for testing said board when said upper probe plate is in a first position, and wherein said upper and lower probe plates each includes probing means for providing incircuit testing of said board when said second probe plate is in a second position.

16. A board fixturing system in accordance with claim 10, wherein one of said probe plates includes functional probing means which is adapted to test said board when said second probe plate is in each of first and second positions, and wherein said probe plates each include probing means which are adapted to provide incircuit testing of said board when said second probe plate is in a third position.

17. A board fixturing system for interfacing a printed circuit board having electronic devices at predetermined locations thereon to probe plates having electrical contacts at predetermined locations, said board fixturing system comprising;
(a) a frame member;
(b) first and second parallel probe plates supported within said frame member; wherein at least one of said plates is movable toward the other said plate;
(c) first probing means carried by said first probe plate, and second probing means carried by said second plate; each said probing means being adapted to send and receive electronic signals to and from predetermined locations on said board when said board is in electrical contact with said probing means;
(d) bias means for biasing at least one of said probe plates against said board in a manner such that said first and second probing means contact said board;
(e) alignment means for aligning said board with said first and second probing means;
(f) conveyor means for engaging and transporting said board from outside said frame member to a position between said first and second probe plates; said conveyor means being further adapted to transport said board from said position between said probe plates to another position outside said frame member; and
(g) disengagement means for disengaging said board from said conveyor means; wherein said disengagement means comprises vertically displaceable supports beneath said conveyor means within said frame member, wherein said displaceable supports are biased to a normally upward position adjacent said conveyor means, and wherein said second probe plate is adapted to urge said board downwardly in a manner such that said displaceable supports are deflected downwardly away from said conveyor means; wherein said board is disengaged from said conveyor means;

wherein at least one of said probe plates is adapted to be moved to a defined position relative to the other of said probe plates.

18. A board fixturing system in accordance with claim 17, wherein said probe plates are horizontally disposed, and wherein said first plate is supported in a stationary position.

19. A board fixturing system in accordance with claim 17, wherein each of said probe plates is adapted to be moved toward the other of said probe plates.

20. A board fixturing system in accordance with claim 17, wherein said probe plates each include transfer pins for transfering electrical signals from one said probe plate to the other said probe plate when said probe plates are biased against said board.

21. A board fixturing system in accordance with claim 17, wherein said second probe plate is supported by a plurality of threaded shafts, wherein said shafts are adapted to be rotated by means of a motor in a manner such that said second probe plate is moved to a predetermined spaced position relative to said first probe plate.

22. A conveyor system for conveying a printed circuit board to a predetermined location, said conveyor system comprising:
(a) first and second parallel rail members;
(b) an endless belt extending along and carried by said first rail member; said endless belt including at least one tab member thereon; said tab member being adapted to engage an edge of said printed circuit board;
(c) drive means adapted to drive said endless belt along said rail member; and
(d) disengagement means comprising vertically displaceable supports carried by said first and second rail members, wherein said displaceable supports are biased to a normally upward position and are vertically displaceable to a lower position, whereby said board is disengaged from said belt.

23. A conveyor system in accordance with claim 22, further comprising a pinch wheel assembly carried by one end of said first rail member.

24. A conveyor system in accordance with claim 23, wherein said pinch wheel is adapted to rotate in the same direction as said belt and is adapted to drive a printed circuit board in the direction in which said belt is moving when said board is positioned between said pinch wheel and said belt.

25. A conveyor system in accordance with claim 22, further comprising a photosensor adapted to determine the position of said printed circuit board in said conveyor system.

26. A conveyor system in accordance with claim 25, comprising a second photosensor adapted to determine the position of said printed circuit board in said conveyor system.

* * * * *

UNITED STATES PATENT AND TRADEMARK OFFICE
CERTIFICATE OF CORRECTION

PATENT NO. : 4,818,933

DATED : April 4, 1989

INVENTOR(S) : Ronald K. Kerschner et al.

It is certified that error appears in the above—identified patent and that said Letters Patent is hereby corrected as shown below:

On the title page, item [75] Inventors: should be
--Ronald K. Kerschner and
Michael L. Bullock--.

Signed and Sealed this

Twelfth Day of December, 1989

Attest:

JEFFREY M. SAMUELS

Attesting Officer     Acting Commissioner of Patents and Trademarks